United States Patent
Wise et al.

(10) Patent No.: US 7,329,602 B2
(45) Date of Patent: Feb. 12, 2008

(54) WIRING STRUCTURE FOR INTEGRATED CIRCUIT WITH REDUCED INTRALEVEL CAPACITANCE

(75) Inventors: Richard S. Wise, New Windsor, NY (US); Bomy A. Chen, Cupertino, CA (US); Mark C. Hakey, Fairfax, VT (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/203,944

(22) Filed: Aug. 15, 2005

(65) Prior Publication Data
US 2006/0035460 A1 Feb. 16, 2006

Related U.S. Application Data

(62) Division of application No. 10/709,204, filed on Apr. 21, 2004, now abandoned.

(51) Int. Cl.
*H01L 21/4763* (2006.01)
(52) U.S. Cl. .................. 438/639; 438/624; 257/E21.59; 257/E21.579; 257/E21.577; 257/E21.587
(58) Field of Classification Search ................ 438/619, 438/622, 624, 666, 639; 257/E21.59, E21.579, 257/E21.577, E21.587
See application file for complete search history.

(56) References Cited

U.S. PATENT DOCUMENTS

| 5,372,969 | A | 12/1994 | Moslehi | 438/106 |
|---|---|---|---|---|
| 5,783,481 | A | 7/1998 | Brennan et al. | 438/623 |
| 5,792,706 | A | 8/1998 | Michael et al. | 438/626 |
| 5,817,572 | A * | 10/1998 | Chiang et al. | 438/624 |
| 5,880,026 | A | 3/1999 | Xing et al. | 438/688 |
| 6,177,329 | B1 * | 1/2001 | Pang | 438/400 |
| 6,211,561 | B1 * | 4/2001 | Zhao | 257/522 |
| 6,228,763 | B1 * | 5/2001 | Lee | 438/639 |
| 6,242,336 | B1 | 6/2001 | Ueda et al. | 438/619 |
| 6,303,491 | B1 * | 10/2001 | Tsai et al. | 438/639 |
| 6,342,722 | B1 | 1/2002 | Armacost et al. | 257/522 |
| 6,368,939 | B1 | 4/2002 | Sasaki | 438/421 |
| 6,380,106 | B1 | 4/2002 | Lim et al. | 438/778 |
| 6,661,094 | B2 | 12/2003 | Morrow et al. | 257/758 |
| 2002/0106891 | A1 * | 8/2002 | Kim et al. | 438/624 |

* cited by examiner

*Primary Examiner*—George Fourson
*Assistant Examiner*—Julio J. Maldonado
(74) *Attorney, Agent, or Firm*—Yuanmin Cai

(57) ABSTRACT

A method of forming a wiring structure for an integrated circuit includes the steps of forming a plurality of features in a layer of dielectric material, and forming spacers on sidewalls of the features. Conductors are then formed in the features, being separated from the sidewalls by the spacers. The spacers are then removed, forming air gaps at the sidewalls so that the conductors are separated from the sidewalls by the air gaps. Dielectric layers above and below the conductors may be low-k dielectrics having a dielectric constant less than that of the dielectric between the conductors. A cross-section of each of the conductors has a bottom in contact with the a low-k dielectric layer, a top in contact with another low-k dielectric, and sides in contact only with the air gaps. The air gaps serve to reduce the intralevel capacitance.

16 Claims, 3 Drawing Sheets

WIRING STRUCTURE FOR INTEGRATED CIRCUIT WITH REDUCED INTRALEVEL CAPACITANCE

CROSS-REFERENCE TO RELATED APPLICATION

This application is a division of U.S. application Ser. No. 10/709,204 filed Apr. 21, 2004, now abandoned.

FIELD OF THE INVENTION

This invention relates to the manufacture of large-scale integrated semiconductor devices, and more particularly to a structure and method for reducing the capacitance in a dielectric layer between metal features in such devices.

BACKGROUND OF THE INVENTION

Ultra-large scale integrated (ULSI) semiconductor devices typically include several layers having metal wiring features (metallization layers) disposed on the top surface of the device, separated from each other in the vertical direction by insulating layers of dielectric material (interlevel dielectric layers). This arrangement of multiple wiring layers and insulating layers is required in order to provide interconnects between devices. The structure of metallization and interlevel dielectric layers is often realized using a damascene process, wherein a pattern is etched into a dielectric layer, the patterned layer is covered with metal and then polished (leaving metal embedded in the etched features), and the metallized layer is then covered with a blanket layer of dielectric material. Vertical studs (metallized vias extending through the interlevel dielectric) are used to connect one metallization level with another. As is understood in the art, the dielectric materials used are chosen for their compatibility with the etching and deposition processes involved, and to minimize the capacitance of the overall structure (that is, to minimize the dielectric constant of the material or combination of materials).

As the dimensions of ULSI devices continue to shrink, the performance of the devices is increasingly limited by the capacitance of the interlevel dielectric. For example, the capacitance of the interlevel dielectric influences the device speed (due to the RC delay in the structure of wiring and insulators), the AC power consumption of the device, and crosstalk. The capacitance of the interlevel dielectric varies in accordance with the dielectric constant of the material. In traditional semiconductor processing technology, silicon dioxide (with a dielectric constant k about 3.85) is used. In order to reduce the undesirable effects of capacitance on ULSI device performance, insulating materials with lower dielectric constants are now being used. Some examples of low-k materials are fluorinated silicon dioxide, amorphous carbon, black diamond, and some polymers. Some structures have also been developed where air gaps (having k close to 1) form part of the interlevel dielectric.

The capacitance of an interlevel dielectric layer includes not only the interlevel capacitance (that is, the capacitance between two vertically separated metallization layers) but also the intralevel line-to-line capacitance (that is, the capacitance between two laterally separated metal lines embedded in the dielectric material). As the dimensions of ULSI devices continue to scale, the aspect ratio of the metal lines continues to increase while the lateral separation between adjacent lines decreases; both of these trends lead to an increase in the intralevel capacitance. Accordingly, the intralevel line-to-line capacitance is becoming a major factor in determining the overall performance of the interconnect. It is therefore highly desirable to reduce the intralevel capacitance by introducing low-k materials into the spaces between metal lines. Most preferably, the spaces between lines would include an air gap while maintaining a physically robust structure.

SUMMARY OF THE INVENTION

The present invention provides a process for forming air gaps adjacent to the 5 conductors in a metallization layer, with the air gaps being at sub-lithographic dimensions. These features result in a series capacitance between the conductors which is lower than the capacitance of the bulk dielectric, thereby reducing the intralevel capacitance. The present invention also provides a stack of low-k material, an air gap, and additional low-k material, forming a sandwich structure which minimizes fringing capacitance.

According to a first aspect of the invention, a method is provided for fabricating a wiring structure for an integrated circuit. This method includes the steps of forming a plurality of features in a layer of dielectric material, and forming spacers on sidewalls of the features. Conductors are then formed in the features, being separated from the sidewalls by the spacers. The spacers are then removed, forming air gaps at the sidewalls so that the conductors are separated from the sidewalls by the air gaps. The features are generally formed using a lithography process characterized by a lithographic dimension; the spacers are formed with a lateral dimension less than the lithographic dimension. Formation of a feature may expose a conducting stud in an underlying dielectric layer, so that formation of a conductor in that feature makes an electrical connection to the stud. A second dielectric layer may be formed overlying the layer of dielectric material and the conductors; the second dielectric layer may have a dielectric constant less than that of the layer of dielectric material.

According to another aspect of the invention, a wiring structure is provided which includes a plurality of conductors with dielectric layers above and below. A plurality of conductors is disposed on a first dielectric layer; the conductors are separated laterally from each other by portions of a second dielectric layer and by air gaps. Each of the conductors has air gaps adjacent thereto separating the conductor from the second dielectric layer. A third dielectric layer overlies the conductors. Each of the conductors has a cross-section wider at a top thereof than at a bottom thereof, in accordance with each of the air gaps having a cross-section wider at a bottom thereof than at a top thereof. The first and third dielectric layers may each have a dielectric constant less than that of the second dielectric layer. Accordingly, a cross-section of each of the conductors has a bottom in contact with the first dielectric layer, a top in contact with the third dielectric layer, and sides in contact only with the air gaps. The air gaps serve to reduce the intralevel capacitance.

DETAILED DESCRIPTION OF PREFERRED EMBODIMENTS OF THE INVENTION

In a preferred embodiment of the invention, metal lines are embedded in a dielectric material, and air gaps are formed between the sides of the metal lines and the dielectric. The process for forming the air gaps will be illustrated here as a modification of the damascene process for forming the metallization and interlevel dielectric layers.

Figure 1:
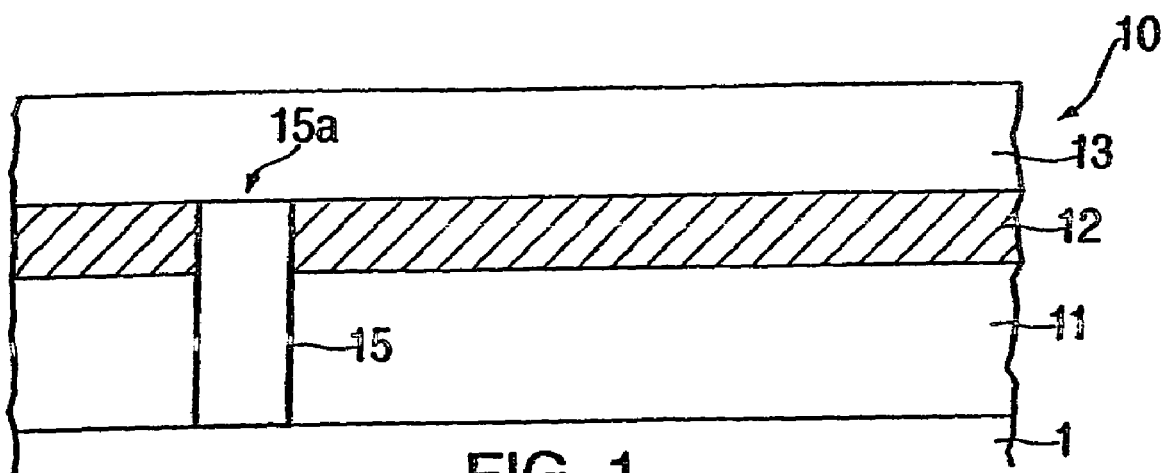
FIG. 1 is a schematic illustration of an interlevel dielectric including a stud interconnect, in which the invention may advantageously be used.

FIG. 1 shows an arrangement of interlevel dielectric layers, where the overall interlevel dielectric 10 includes a layer of low-k material 12 sandwiched between two other dielectric layers 11, 13. A via has been formed in layers 11 and 12 and subsequently filled with metal to form a stud 15, which provides electrical connection to the underlying level 1. Layer 13 is deposited over layer 12 after formation of the stud. The combination of layers 11 and 12 thus forms a via level, while layer 13 (sometimes called a wiring level or trough level) is patterned so as to have the metal wiring embedded therein.

Figure 2:
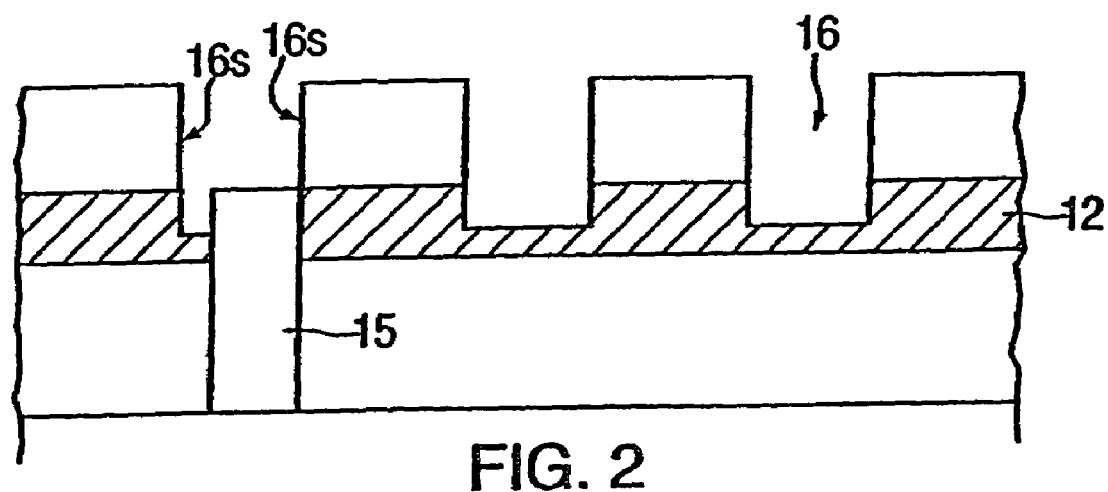
FIGS. 2-5 illustrate steps in a process for forming air gaps adjacent to conducting lines, in accordance with an embodiment of the invention.

Layer 13 is patterned and etched in accordance with the desired wiring pattern, so that troughs 16 are formed (FIG. 2); the patterning is done using conventional lithographic techniques. Electrical connection between the wiring pattern in layer 13 and the underlying levels requires that a metallized trough make contact with stud 15. As shown in FIG. 2, an overetch is performed so that layer 12 is partially etched, to ensure that the top surface 15a of stud 15 is exposed. The lithographic groundrules are chosen to provide troughs 16 with sufficient width to ensure that the stud is captured between the trough sidewalls 16s.

Figure 3:
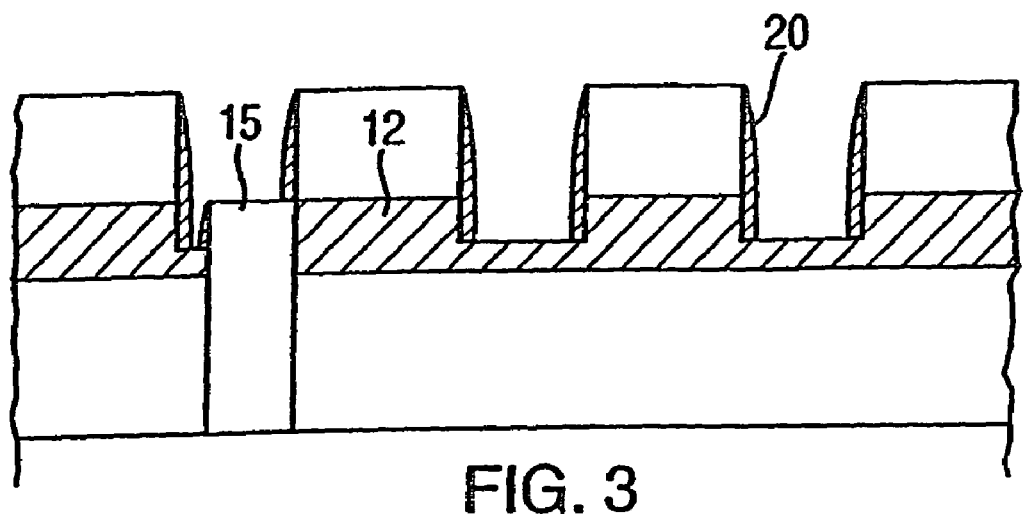

Spacers 20 are then formed on the sidewalls of the troughs, as shown in FIG. 3. This may be done by depositing a conformal layer of spacer material over patterned layer 13, and then removing the material by a directional etch process (known to those skilled in the art). As shown in FIG. 3, the spacers are typically wider at the bottom than at the top. The spacer material must be capable of being etched selectively with respect to the metal of the wiring structure and the dielectric material of layers 12 and 13. A preferred spacer material is silicon nitride. Alternative spacer materials include amorphous Si and (if Cu is used for the wiring structure) Al.

Figure 4:
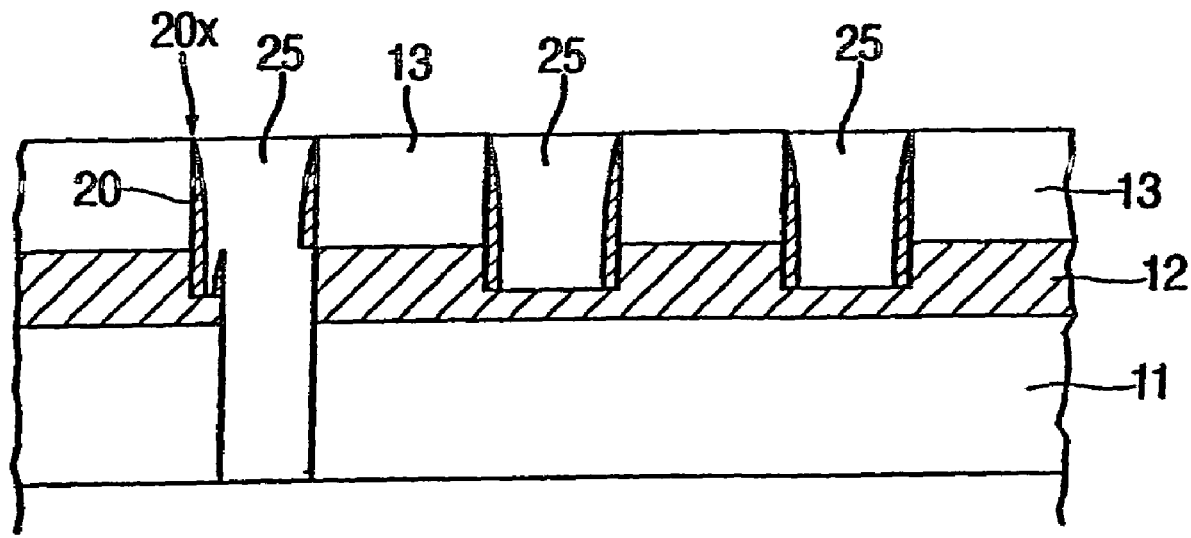

Troughs 16 are then filled with metal (e.g. by electroplating or CVD) and the structure is polished, in accordance with the damascene process. Metal lines 25 are thus formed in the dielectric (FIG. 4). The overetch process noted above results in the bottom portion of metal line 25 being surrounded by low-k dielectric 12; this in turn mitigates the effect of fringing fields in the finished device. The polishing process exposes the top surface of layer 13, and also exposes a surface portion 20x at the top of each sidewall spacer 20.

Figure 5:
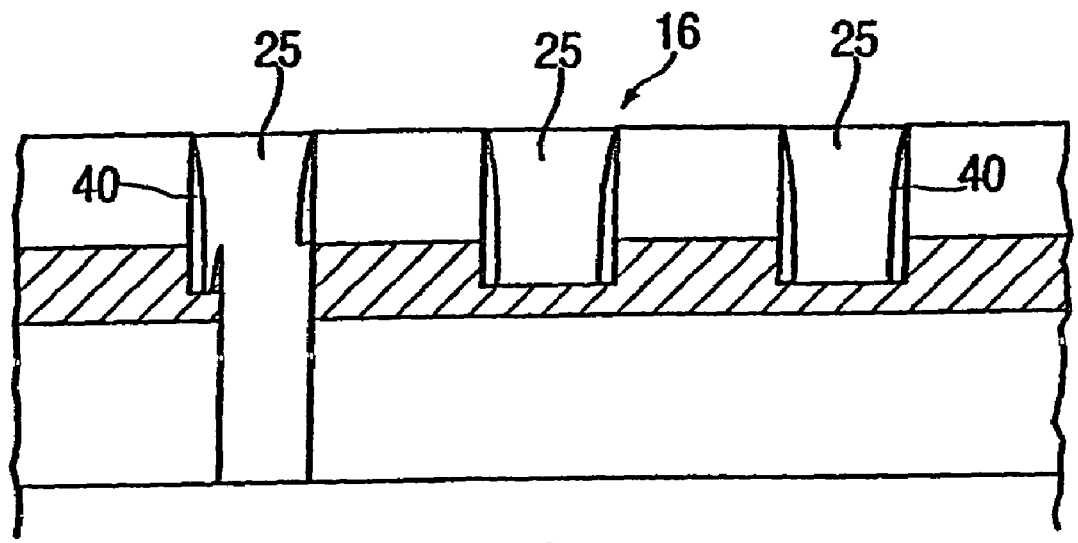

The sidewall spacers 20 are then removed in an etch process which is selective with respect to the metal lines 25 and the dielectric materials in layers 12 and 13. This is done by exposing surface portion 20x to an etching agent; a wet chemical etch or downstream etch process may be used. Air gaps 40 are thus formed between the sides of the metal lines 25 and the walls of the troughs 16, as shown in FIG. 5. (A small portion of unetched spacer material, isolated from the sidewall by the metal line, may remain on the side of stud 15.) It is noteworthy that the width of the air gaps depends on the original deposited thickness of the spacer material, so that the air gaps have a sub-lithographic thickness dimension. Although the sides of metal lines 25 facing the sidewalls are in contact only with air, their bottom surfaces are in contact with dielectric layer 12 and/or the top of stud 15. Owing to the original shape of the sidewall spacers 20, the metal lines in cross-section are wider at the top than at the bottom.

Figure 6:
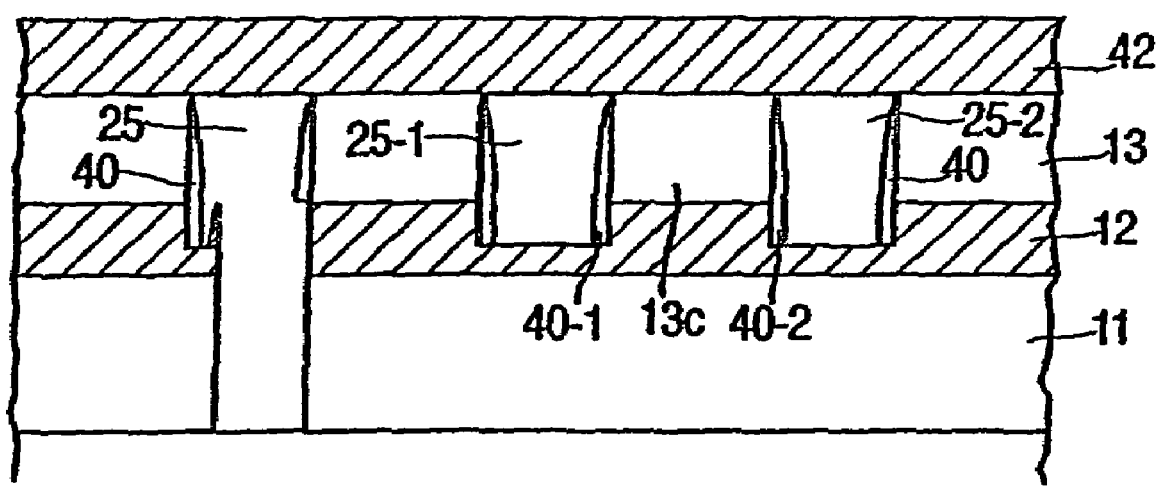
FIG. 6 illustrates a structure having conducting lines, low-k interlevel dielectric layers, and an intralevel dielectric including an air gap, in accordance with another embodiment of the invention.

An additional layer 42 of low-k dielectric material may then be deposited over layer 13 and the top of metal lines 25, as shown in FIG. 6. The metal lines are thus encapsulated in a vertical sandwich structure having low-k material above and below (layers 12 and 42), and an air gap 40 therebetween. Since the base and top of the metal lines are covered by low-k material, the effect of fringing fields is minimized. In this embodiment, dielectric layers 11 and 13 are made of a conventional material such as silicon dioxide, which offers the advantages of thermal stability and process simplicity.

The advantage provided by the present invention may be seen by calculating the intralevel capacitance between two neighboring metal lines 25-1 and 25-2 in FIG. 6. This capacitance C may be represented by three capacitances in series: $C_{A1}$, the capacitance of air gap 40-1; $C_D$, the capacitance of portion 13c of dielectric layer 13 between the metal lines; and $C_{A2}$, the capacitance of air gap 40-2. Capacitance C then is given by $$C=1/(1/C_{A1}+1/C_D+1/C_{A2}).$$

Each capacitance can be expressed as $C=\epsilon A/d$, where $\epsilon$ is the dielectric constant of the material, A is the lateral cross-sectional area, and d is the thickness of the material. Using $\epsilon=1$ for air, the intralevel capacitance (per unit cross-sectional area) C/A is given by $$C/A=(2d_A+d_D/\epsilon)^{-1},$$

where $d_A$ is the thickness of each air gap and $d_D$ is the thickness of portion 13c (that is, the lateral dimension of layer 13 between metal lines 25-1 and 25-2). Assuming that layers 11 and 13 are made of silicon dioxide ($\epsilon=3.85$), and that the lithographic groundrule is 0.16 μm, the capacitances for air gaps of various widths are as follows:

| $d_A$ (μm) | $d_D$ (μm) | C/A (μm$^{-1}$) | Equivalent $\epsilon$ |
|---|---|---|---|
| 0 | 0.16 | 24.06 | 3.85 |
| 0.01 | 0.14 | 17.74 | 2.83 |
| 0.02 | 0.12 | 14.05 | 2.25 |
| 0.03 | 0.10 | 11.63 | 1.86 |
| 0.04 | 0.08 | 9.92 | 1.59 |

Accordingly, an equivalent dielectric constant below 2.0 can be obtained using the lateral air gaps of the present invention. This is significant because presently available inorganic low-k materials still have $\epsilon$ about 3.5, while organic low-k materials have $\epsilon$ near 2.8 after a typical annealing process. The present invention therefore offers a reduction in intralevel capacitance equal to, if not better than, that obtainable with low-k materials between metal lines, while retaining the structural advantages of using conventional silicon dioxide material. Alternatively, this invention can be practiced with any convenient dielectric material (including low-k materials), to obtain even lower intralevel capacitances.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating a wiring structure for an integrated circuit, the method comprising steps of:
   forming a plurality of features in a first and a second layer of dielectric material, each of the features having sidewalls and a bottom, said bottom and a portion of said sidewalls being formed in said first layer of dielectric material, said dielectric material of said bottom and said portion of said sidewalls being a same dielectric material;
   forming spacers on the sidewalls;
   forming conductors in the features, the conductors being separated from the sidewalls by the spacers;
   removing the spacers, thereby forming air gaps at the sidewalls so that the conductors are separated from the sidewalls by the air gaps; and
   forming a third layer of dielectric material, having a dielectric constant less than that of said second layer of dielectric material, overlying said second layer of dielectric material and said conductors.

2. A method according to claim 1, wherein said step of forming the spacers further comprises:
   depositing a layer of spacer material on the sidewalls and bottom of each feature; and
   removing the spacer material from the bottom using a directional etch process.

3. A method according to claim 1, wherein
   said step of forming the conductors further comprises exposing a top surface portion of each of the spacers, and
   said step of removing the spacers comprises exposing said top surface portion to an etching agent.

4. A method according to claim 1, wherein the features are formed using a lithography process characterized by a lithographic dimension, and the spacers are formed with a lateral dimension less than said lithographic dimension.

5. A method according to claim 1, wherein the formation of said features exposes a conducting stud in the first dielectric layer, so that the formation of said conductors in said features makes an electrical connection to the stud.

6. A method according to claim 1, wherein the spacers are formed with a lateral dimension greater near the bottom of the feature than near the top of the feature, so that each of the conductors is wider at a top thereof than at the bottom.

7. A method for fabricating a wiring structure for an integrated circuit, the method comprising steps of:
   forming a plurality of features in a first and a second layer of dielectric material, each of the features having sidewalls and a bottom, said bottom and a portion of said sidewalls being formed in said first layer of a single dielectric material, said single dielectric material having a dielectric constant less than that of said second layer of dielectric material;
   forming spacers on the sidewalls;
   forming conductors in the features, the conductors being separated from the sidewalls by the spacers;
   removing the spacers, thereby forming air gaps at the sidewalls so that the conductors are separated from the sidewalls by the air gaps; and
   forming a third layer of dielectric material, having a dielectric constant less than that of said second layer of dielectric material, overlying said second layer of dielectric material and said conductors.

8. A method according to claim 7, wherein said step of forming the spacers further comprises:
   depositing a layer of spacer material on the sidewalls and bottom of each feature; and
   removing the spacer material from the bottom using a directional etch process.

9. A method according to claim 7, wherein
   said step of forming the conductors further comprises exposing a top surface portion of each of the spacers, and
   said step of removing the spacers comprises exposing said top surface portion to an etching agent.

10. A method according to claim 7, wherein the features are formed using a lithography process characterized by a lithographic dimension, and the spacers are formed with a lateral dimension less than said lithographic dimension.

11. A method according to claim 7, wherein the formation of said features exposes a conducting stud in the first dielectric layer, so that the formation of said conductors in said features makes an electrical connection to the stud.

12. A method according to claim 7, wherein the spacers are formed with a lateral dimension greater near the bottom of the feature than near the top of the feature, so that each of the conductors is wider at a top thereof than at the bottom.

13. A method for fabricating a wiring structure for an integrated circuit, the method comprising steps of:
   forming a plurality of features in the first and a second layer of dielectric material, each of the features having sidewalls and a bottom, said bottom and a portion of said sidewalls being formed in said first layer of a single dielectric material, said single dielectric material having a dielectric constant less than that of said second layer of dielectric material;
   depositing a layer of spacer material on the sidewalls and bottom of each feature;
   removing the spacer material from the bottom using a directional etch process;
   forming conductors in the features, the conductors being separated from the sidewalls by the spacers;
   exposing a top surface portion of the spacers;
   subjecting said exposed top surface portion of the spacers to at least one etching agent to remove the spacers and forming air gaps that separate the conductors from the sidewalls;
   forming a third layer of dielectric material, having a dielectric constant less than that of said second layer of dielectric material, overlying said second layer of dielectric material and said conductors; and
   selecting the first and third layer of dielectric material to have a dielectric constant less than that of said second layer and thereby reducing fringe capacitance at the two ends of said plurality of features.

14. A method according to claim 13, wherein the features are formed using a lithography process characterized by a lithographic dimension, and the spacers are formed with a lateral dimension less than said lithographic dimension.

15. A method according to claim 13, wherein the formation of said features exposes a conducting stud in the first layer of dielectric material and the formation of said conductors in said features makes an electrical connection to the stud.

16. A method according to claim 13, wherein the spacers are formed with a lateral dimension greater near the bottom of the feature than near the top of the feature, so that each of the conductors is wider at a top thereof than at the bottom.

* * * * *